United States Patent [19]

Gallet et al.

[11] 4,003,741
[45] Jan. 18, 1977

[54] METHOD OF PREPARATION OF SEMICONDUCTING COMPOUNDS

[75] Inventors: Jean Gallet; Jean Marine; Bernard Pelliciari; Bernard Schaub, all of Grenoble, France

[73] Assignee: Commissariat a l'Energie Atomique, Paris, France

[22] Filed: Dec. 9, 1975

[21] Appl. No.: 639,112

[30] Foreign Application Priority Data

Dec. 24, 1974 France .............................. 74.42769

[52] U.S. Cl. .............................. 75/135; 75/65 ZM; 75/129
[51] Int. Cl.² .......................................... C22C 1/02
[58] Field of Search ................ 75/65 ZM, 135, 129

[56] References Cited

UNITED STATES PATENTS 3,173,783   3/1965   Stern .................................... 75/135
3,730,705   5/1973   Latrobe ............................. 75/135

*Primary Examiner*—P. D. Rosenberg
*Attorney, Agent, or Firm*—Cameron, Kerkam, Sutton, Stowell & Stowell

[57] ABSTRACT

A method of preparation of a ternary or quaternary alloy composed of the elements $A^1 A^2 A^3$ (ternary alloy) or the elements $A^1 A^2 A^3 A^4$ (quaternary alloy) consists of the successive steps of preparation of one or a number of binary alloys such as $A^1 A^2$, purification of the binary alloys by zone melting, placing of the binary alloy or alloys which are in the solid state together with the other constituent elements of the alloy within a container in the presence of a solvent, crystallization of the ternary or quaternary alloy by melting all the elements within the container and recrystallization in the presence of the solvent.

7 Claims, 3 Drawing Figures

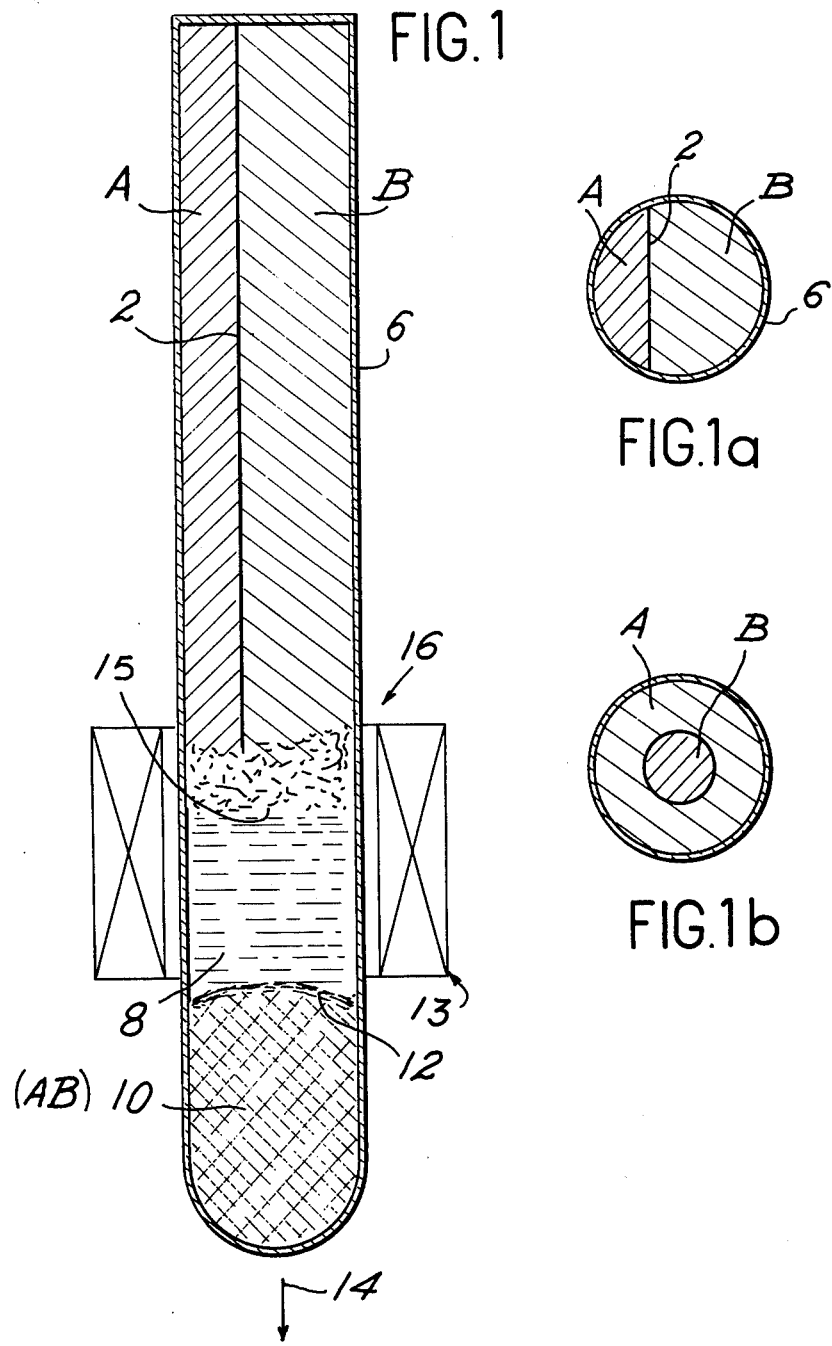

METHOD OF PREPARATION OF SEMICONDUCTING COMPOUNDS

This invention relates to an improvement in the "traveling solvent method" which consists in passing a solvent zone through an ingot of a semiconducting-compound alloy.

It is in fact known that a solvent zone is passed through an ingot of this type in order to enhance the crystal properties of an alloy such as a semiconducting compound, for example. The passage of the solvent zone has the advantage of recrystallizing the compound at low temperature, namely at a temperature below that of crystallization of the compound when no solvent is present, and consequently of obtaining a compound of higher purity and better quality from the point of view of crystal arrangement, that is to say with less twinning and microprecipitates. However, this method presupposes that the semiconducting compound has previously been prepared by a conventional metallurgical technique. In point of fact, it is sometimes difficult or even impossible to prepare from simple elements and at high temperature, the semiconducting compound or alloy which is subsequently intended to be recrystallized in solvent at low temperature. Moreover, when it proves possible to carry out high-temperature synthesis, this is often a source of contamination.

The method of preparation of semiconducting compounds in accordance with the invention is precisely intended to overcome the disadvantages mentioned above and permits both the synthesis and low-temperature recrystallization of the semiconducting compound in a single operation.

The method makes it possible to obtain both ternary and quaternary compounds with equal ease.

The method in accordance with the invention for the preparation of ternary or quaternary alloys composed of the elements $A^1 A^2 A^3$ (ternary alloy) or the elements $A^1 A^2 A^3 A^4$ (quaternary alloy) consists of the following steps:
the preparation of one or a number of binary alloys such as $A_1 A_2$,
the purification of said binary alloys by zone melting,
the placing of said binary alloy or alloys which are in the solid state together with the other constituent elements of the alloy within a container in the presence of a solvent,
the crystallization of the ternary or quaternary alloy by melting all the elements within said container and recrystallization in the presence of the solvent.

Thus in order to produce a ternary alloy $A^1A^2A^3$, a binary alloy $A^1A^2$ is prepared and purified by zone melting, this first binary alloy is placed within the container in the presence of the element $A^3$ and of a solvent, whereupon the entire mass is crystallized.

The production of a quaternary alloy $A^1A^2A^3A^4$ consists in the preparation of one or two binary alloys $A^1A^2$ and if necessary $A^3A^4$ which are purified by zone melting, these two alloys (or alternatively one alloy and the two other remaining elements which are not in the alloy state) are placed in the container in the presence of a solvent, whereupon the entire mass is melted and recrystallized.

In order to form a final semiconducting-compound alloy, at least one of the elements $A^1A^2A^3A^4$ is selected from a column of the Periodic Table of Elements corresponding to the metals and the other element or elements are selected from a column of the Periodic Table of Elements corresponding to the metalloids. In the case in which the ternary or quaternary semiconducting compounds comprise a number of metals, these latter are selected from the same column of the Periodic Table. Similarly, if the final alloy is prepared from a number of metalloids, these latter are selected from the same column.

Preliminary zone melting makes it possible to purify the binary alloy under more favorable conditions (lower melting point, for example) than the same purification by zone melting which is employed for purifying separately each element of said binary alloy.

The method in accordance with the invention makes it possible in the stage of melting and recrystallization in the presence of a solvent to recover the heat of formation of the ternary of quaternary alloy for the purpose of melting the different elements.

In the event that the metallic or metalloidal elements or alloys of said substances are in the solid state, they are placed in the container in the form of bars and preferentially in stoichiometric proportions (except in the case of the element employed as solvent in the event that the solvent is a homosolvent, that is, one of the elements of the final alloy).

The solvent is either a homosolvent, namely one of the elements of the alloy or a heterosolvent namely an element which is different from the elements of the alloy and does not react with said elements.

The use of a metallic element and of an alloy of two metalloidal elements results in the formation of ternary semiconducting compounds and the same applies to the use of a metalloidal element and of an alloy formed by two metallic elements.

The use of an alloy formed by two metallic elements and of an alloy formed by two metalloidal elements results in the production of quaternary semiconducting compounds. As is readily apparent, quaternary semiconducting compounds could be produced by employing two ingots of metallic elements from the same column placed next to a third ingot constituted by an alloy of two metalloidal elements. The same applies when employing two ingots of metalloidal elements from the same column placed next to a third ingot constituted by an alloy of two metallic elements from the same column. It can readily be understood that the use of an ingot of a metallic element which is placed next to an ingot formed by an alloy of three metalloidal elements results in the formation of quaternary semiconducting compounds and that the same applies to the use of an ingot of a metalloidal element placed next to an ingot formed by an alloy of three metallic elements.

In accordance with a preferential embodiment of the invention, the alloys are prepared from two metallic elements selected from the columns II A and II B as well as from two metalloidal elements selected from column VI B.

Similarly, the use of binary metallic alloys such as MgZn, $MgZn_2$, MgCd, CdZn, CdHg, ZnHg and metalloidal alloys such as TeSe which have previously been purified by zone melting for example serve in accordance with the invention to prepare ternary semiconducting II–VI compounds such as MgZnTe, CdZnTe, ZnHgTe, MgCdTe, CdHgTe, CdTeSe, ZnTeSe or quaternary semiconducting II–VI compounds such as MgZnTeSe, CdZnTeSe.

The solvent employed for the application of the invention can be a homosolvent (Zn, Cd, Hg, Te, Se . . .

) or a heterosolvent (Sn, Ga, In, Bi, Pb, Cl₂Cd, Cl₂Zn ...).

Further properties and advantages of the invention will become more readily apparent from the following description of one example of crystallization which is given by way of explanation but not in any limiting sense, reference being made to the single accompanying figure which shows the passage of a solvent zone through a composite bar.

| | |
|---|---|
| $A^1$ and $A^2$ | designate two metallic elements from the same column, |
| $B^1$ and $B^2$ | designate two metalloidal elements from the same column, |
| $A^1A^2 - B^1$ | ⎫ |
| $A^1 - B^1B^2$ | ⎬ designate ternary compounds |
| $A^1A^2 - B^1B^2$ | designates a quaternary compound |
| $A^1A^2$ | designates an alloy formed by two elements $A^1$ and $A^2$ |
| $B^1B^2$ | designates an alloy formed by two elements $B^1$ and $B^2$ |
| A and B | designate respectively the ingot of elements $A^1$ or $A^2$ or of an alloy $A^1A^2$ and the ingot of elements $B^1$ or $B^2$ or of an alloy $B^1B^2$ |
| AB | designates the ternary or quaternary crystal. |

As shown in FIG. 1, the two ingots A and B which constitute the bar are of cylindrical shape, have the same diameter, are truncated laterally along the face 2 and are applied against each other along said face. The assembly formed by said two ingots A and B is introduced into a cylindrical quartz container 6 in a vertical position in order to be traversed by the solvent zone 8 which has previously been placed at that end of the container at which the crystallization begins and thus to be recrystallized after the solvent zone has passed through the portion 10. An induction furnace for example and as shown at 13 heats that portion of the container and its contents which are located in the oppositely-facing portion of the furnace. The container moves in the direction of the arrow 14 through the annular space defined by the furnace. In this example of construction, the container is vertical but it will be readily apparent that the method is equally effective when the container is either horizontal or inclined.

During the growth process, there can be distinguished successively the zone 10 in which is placed the crystal AB, the crystallization interface 12, the solvent zone 8, the dissolution interface 15, a reaction commencement zone 16 in which the elements are in a proportion close to stoichiometry for the purpose of forming the crystal AB.

The ingots A and B can be either in the form of a solid ingot forcibly fitted within a hollow cylindrical ingot or in any other form which is suited to the shape of the container. FIG. 1a is a top view of the ingots shown in FIG. 1 and FIG. 1b shows one form of construction in which a solid ingot is forcibly fitted in a hollow cylindrical ingot, both ingots being shown in a top view.

It is possible in accordance with the invention to form quaternary compounds corresponding to the formula:

$$A^1_{x_1} A^2_{x_2} B^1_{y_1} B^2_{y_2}$$

with $x_1 + x_2 = y_1 + y_2 = 0.5$ ; $x_1$ $x_2$ $y_1$ $y_2$ being the respective molar fractions of the metallic elements $A^1$ and $A^2$ and of the metalloidal elements $B^1$ and $B^2$. If it is desired to prepare a ternary compound, it is only necessary to apply the same chemical formula by taking one of the terms $x_1$, $x_2$, $y_1$ or $y_2$ equal to 0.

The method of preparation is the same as that of the binary compounds except for the fact that the two bars A and B are constituted respectively in this example by alloys in predetermined proportions of two elements $A^1$ and $A^2$ taken from the same column and of two elements $B^1$ and $B^2$ taken from the same column of the Periodic Table of Elements. The ratio of their respective cross-section takes into account the molecular masses and the densities of each alloy as mentioned earlier.

The system is then recrystallized under the same conditions as before by passage of a solvent zone, the solvent being previously placed at that extremity of the assembly of ingots at which the crystallization process begins.

The concentrations of $A^1$, $A^2$, $B^1$, $B^2$ in the solvent zone remain stationary since this zone is re-supplied during the growth process with the ingots of the alloys $A^1A^2$ and $B^1B^2$ in the stoichiometric proportion.

A further advantage of the method according to the invention is to make it possible in some cases and by means of a suitable metallurgical treatment to purify alloys of $A^1$ and $A^2$ and $B^1$ and $B^2$ more readily than $A^1$, $A^2$, $B^1$, $B^2$ taken separately. The method according to the invention also makes it possible to employ solid alloys having a base of mercury (for example CdHg or ZnHg).

EXAMPLE

Crystallization of MgZnTe from Tellurium and the Eutectic Compound MgZn.

The composition of the eutectic compound MgZn is 92.3% Zn and 7.7% Mg.

In consequence, $$\frac{x_{Zn}}{x_{Mg}} = 11.987$$

in the eutectic compound.

In the ternary compound MgZnTe, we have $$x_{Zn} + x_{Mg} + x_{Te} = 1 \text{ with } x_{Te} = 0.5$$

hence $$x_{Zn} + x_{Mg} = 0.5$$

If the eutectic compound MgZn is therefore employed for preparing the compound MgZnTe, the relative proportions of Zn and Mg in the compound will be given by the resolution of

| | |
|---|---|
| $x_{Zn} + x_{Mg} = 0.5$ | $x_{Mg} = 0.0385$ |
| | $x_{Zn} = 0.4615$ |
| $\dfrac{x_{Zn}}{x_{Mg}} = 11.987$ | $x_{Te} = 0.5$ |

This corresponds to
0.9862% by weight of Mg
31.7879% by weight of Zn
67.2258% by weight of Te.

The laterally truncated ingots are prepared and juxtaposed, one ingot being made of tellurium and the other being formed by the eutectic compound MgZn obtained after purification by melting of successive zones. The diameter of these ingots is initially 21 mm; the thickness S of said ingots if 13 mm in the case of tellurium and 8 mm in the case of the eutectic compound so that the transverse cross-section of the eutectic compound represents 31.834% of the cross-sectional area of the entire assembly, thus conforming to the conditions of concentration ratio. The complete assembly formed by these ingots is introduced into a cylindrical quartz ampoule. The extremity of said ampoule at which the crystallization process begins has been filled with 30 g of tellurium which is intended to perform the function of the solvent zone whilst the other extremity is sealed by a quartz cap. The complete assembly is introduced progressively into an annular furnace so as to displace the solvent zone through the ingot assembly at a rate of 0.3 mm per hour, the temperature of the heating ring being 1000° C. There is thus obtained a crystal of the mixed compound MgZnTe corresponding to the formula:

$$Mg_{0.0385}Zn_{0.4615}Te_{0.5}.$$

When examined by cathodoluminescence, said compound has a pure emission in the green region at a wavelength which is shorter by 100 A than that obtained with the compound ZnTe. The semiconductor compounds formed in accordance with this method are wholly suited to the fabrication of electroluminescent diodes, nuclear or infrared detectors.

What we claim is:

1. A method of preparation of a ternary alloy composed of the elements $A^1$, $A^2$ and $A^3$, wherein said method consists of the following steps:
    the preparation of a binary alloy $A^1A^2$,
    the purification of said binary alloy by zone melting,
    the placing of said binary alloy $A^1A^2$ which is in the solid state together with the third element $A^3$ within a container in the presence of a solvent,
    the crystallization of the ternary alloy by melting all the elements $A^1A^2 + A^3$ and recrystallization in the presence of the solvent.

2. A method of preparation of a quaternary alloy composed of the chemical elements $A^1$, $A^2$, $A^3$ and $A^4$, wherein said method consists of the following steps:
    the preparation of at least one binary alloy,
    the purification by zone melting of said binary alloy or alloys,
    the placing of said binary alloy or alloys together with the other elements which are intended to constitute the alloy within a container in the presence of a solvent,
    the crystallization of the quaternary alloy by melting all the elements within said container and recrystallization in the presence of the solvent.

3. A method according to claim 1, wherein said elements are placed within said container in the stoichiometric proportions of the final alloy.

4. A method according to claim 1, wherein the solvent is a homosolvent, that is to say an element of the alloy.

5. A method according to claim 1, wherein the solvent is a heterosolvent which is different from the elements of the alloy.

6. A method according to claim 1, wherein the compounds such as MgZnTe, MgCdTe, CdHgTe, CdTeSe, ZnTeSe are crystallized from the binary alloys MgZn, CdZn, MgCd, CdHg, TeSe which have been purified by zone melting.

7. A method according to claim 2, wherein the compounds such as MgZnTeSe, CdZnTeSe are crystallized from a pair of binary alloys MgZn + TeSe and CdZn + TeSe, each binary alloy having been purified by zone melting.

* * * * *